United States Patent
Lo et al.

(10) Patent No.: US 12,426,179 B2
(45) Date of Patent: Sep. 23, 2025

(54) CASING HAVING EXTERNAL SHELL SURFACE

(71) Applicant: AETINA CORPORATION, New Taipei (TW)

(72) Inventors: Chih-Jung Lo, New Taipei (TW); Ying-Jui Hung, New Taipei (TW); Yung-Ho Lee, New Taipei (TW)

(73) Assignee: AETINA CORPORATION, New Taipei (TW)

( * ) Notice: Subject to any disclaimer, the term of this patent is extended or adjusted under 35 U.S.C. 154(b) by 162 days.

(21) Appl. No.: 18/522,289

(22) Filed: Nov. 29, 2023

(65) Prior Publication Data

US 2024/0306313 A1 Sep. 12, 2024

Related U.S. Application Data

(60) Provisional application No. 63/451,240, filed on Mar. 10, 2023.

(51) Int. Cl.
| | |
|---|---|
| H05K 5/02 | (2006.01) |
| G06F 1/18 | (2006.01) |
| H01R 13/518 | (2006.01) |
| H01R 25/00 | (2006.01) |
| H05K 5/03 | (2006.01) |
| H05K 5/10 | (2025.01) |

(52) U.S. Cl.
CPC .......... *H05K 5/0217* (2013.01); *G06F 1/181* (2013.01); *H01R 13/518* (2013.01); *H01R 25/006* (2013.01); *H05K 5/0221* (2013.01); *H05K 5/0226* (2013.01); *H05K 5/03* (2013.01); *H05K 5/10* (2025.01)

(58) Field of Classification Search
None
See application file for complete search history.

(56) References Cited

U.S. PATENT DOCUMENTS

| | | | | |
|---|---|---|---|---|
| 9,211,025 | B1* | 12/2015 | Elhawwashy | A47G 29/20 |
| 11,057,689 | B1* | 7/2021 | Klein | G06K 19/06028 |
| 11,434,039 | B2* | 9/2022 | Limousin | B65D 5/5028 |
| 11,568,353 | B2* | 1/2023 | Davis | G06Q 10/0833 |
| 2023/0371729 | A1* | 11/2023 | Williams | G07C 9/00896 |
| 2024/0199293 | A1* | 6/2024 | Cotte | B65D 55/06 |

* cited by examiner

*Primary Examiner* — Xanthia C Relford

(57) ABSTRACT

A casing having an external shell surface includes a casing body, a magnetic element, and an external shell surface. The casing body includes multiple sidewalls and a movable cover, wherein the multiple sidewalls and the cover enclose to form a box shape. The magnetic element is disposed on at least one sidewall of the casing body. The external shell surface and the magnetic element are magnetically attracted so as to fix the external shell surface on an outer surface of the sidewall. The sidewall provided with the external shell surface has a through hole. The casing having an external shell surface prevents an individual from removing the casing without a user's authorization.

9 Claims, 5 Drawing Sheets

CASING HAVING EXTERNAL SHELL SURFACE

CROSS-REFERENCE TO RELATED APPLICATION

This non-provisional application claims priority under 35 U.S.C. § 119 (e) on U.S. provisional Patent Application No. 63/451,240 filed on Mar. 10, 2023, the entire contents of which are hereby incorporated by reference.

BACKGROUND OF THE INVENTION

1. Field of the Invention

The present disclosure relates to a casing of a device, and in particular to a casing having an external shell surface.

2. Description of the Related Art

Accompanied with the development of technologies, computing devices (for example, server devices, artificial intelligence computing devices, and cloud computing systems) featuring advantages of processing, computing, and storing large amounts of data, and have become extremely popular products.

However, options for designs of heat dissipation holes and materials of casings of computing devices are rather greatly limited. For example, a casing of a computing device is usually made of a metal material, and is unsuitable to be provided with large holes. Thus, the appearance design of such computing device is restricted to a quite large extent.

In order to provide a casing with more protection and functionality or provide attractive appearance design, one feasible approach is to additionally provide a detachable external shell surface to an existing casing. However, the external shell surface may fall off due to issues such as accidents including vibration or human causes, or be removed by other individuals without a user's authorization.

BRIEF SUMMARY OF THE INVENTION

Therefore, to overcome various issues of a conventional casing, the present disclosure provides a casing having an external shell surface.

To achieve the above and other objects, the present disclosure provides a casing having an external shell surface. The casing comprises a casing body, including a plurality of sidewalls and a movable cover. The plurality of sidewalls and the cover enclose to form a box shape. A magnetic element, disposed on at least one of the sidewalls of the casing body and an external shell surface are provided, wherein the external shell surface and the magnetic element are magnetically attracted so as to fix the external shell surface on an outer surface of the sidewall, and the sidewall provided with the external shell surface has a through hole or a plurality of through holes.

In an embodiment of the present disclosure, the magnetic element is disposed on the outer surface of the sidewall.

In an embodiment of the present disclosure, the magnetic element is disposed on an inner surface of the sidewall.

In an embodiment of the present disclosure, the magnetic element includes a head and a neck. The head is disposed on an inner surface of the sidewall, the neck extends into a through hole and is connected to the external shell surface, and a width of the head is greater than a width of the through hole.

In an embodiment of the present disclosure, the external shell surface has a protruding column, which has a position corresponding to the through hole and is accommodated in the through hole.

In an embodiment of the present disclosure, the protruding column protrudes from an inner surface of the sidewall.

In an embodiment of the present disclosure, the protruding column does not protrude from an inner wall of the sidewall, the magnetic element is disposed on the inner surface of the sidewall and is magnetically attracted to the protruding column, and a width of the magnetic element is greater than the width of the through hole.

In an embodiment of the present disclosure, the casing having an external shell surface further includes a lock disposed at the cover.

In an embodiment of the present disclosure, the external shell surface has an opening corresponding to an input/output (I/O) port, and the opening has a position away from the through hole.

Thus, the casing having an external shell surface of the present disclosure prevents an individual from removing the casing without a user's authorization.

DETAILED DESCRIPTION OF THE INVENTION

To fully understand the present disclosure, the present disclosure is described in detail by way of the specific embodiments with the accompanying drawings below. A person skilled in the art would be able to understand the objects, features and effects of the present disclosure from the disclosure of the present application. It should be noted that, the disclosure may be implemented or applied by other specific embodiments, and changes and modifications may also be made on the basis of different perspectives and applications to various details in the description without departing from the spirit of the present disclosure. Technical contents associated with the present disclosure are described in detail below, and it should be noted that the disclosure is not to be construed as limitations to the scope of protection of the present disclosure. Associated details are as given in the description below.

Figure 1:
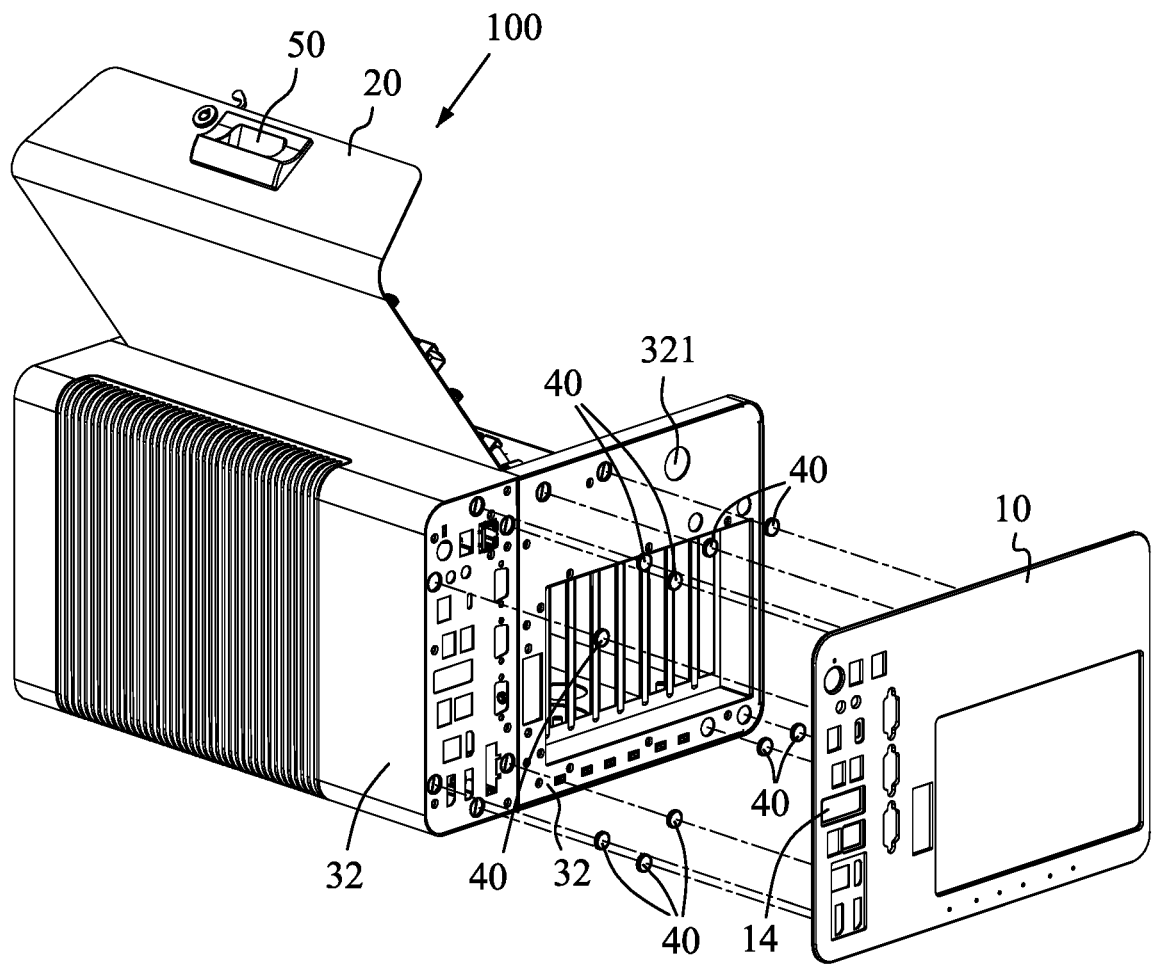
FIG. 1 is an assembly diagram of a casing having an external shell surface according to an embodiment of the present disclosure.
Figure 2:
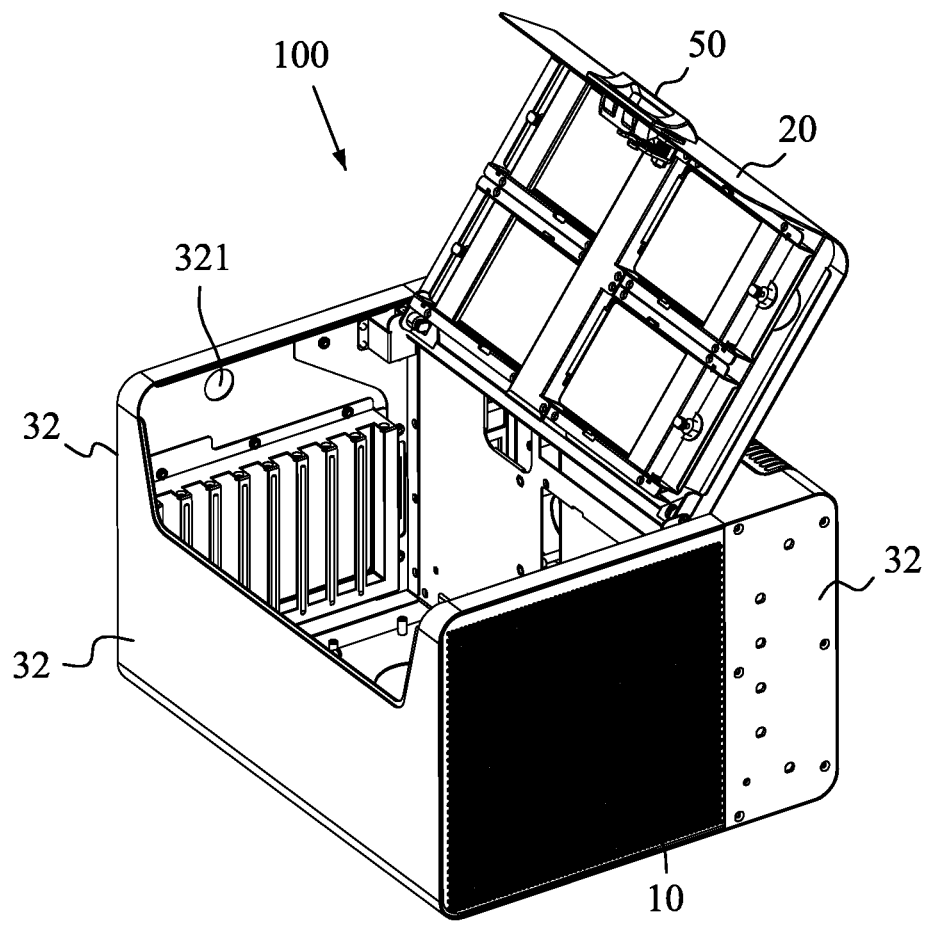
FIG. 2 is a perspective diagram of the casing having the external shell surface according to an embodiment of the present disclosure.

As shown in FIG. 1 and FIG. 2, a casing 100 having an external shell surface according to an embodiment of the present disclosure includes a casing body, a magnetic element 40 and an external shell surface 10.

The casing body includes a plurality of sidewalls 32 and a movable cover 20, and the movable cover 20 is pivotally rotatable relative to the plurality of sidewalls 32 so as to open or close an internal space of the casing body. The plurality of sidewalls 32 and the cover 20 enclose to form a box shape.

The magnetic element 40 is disposed on at least one of the sidewalls 32 of the casing body. Means for disposing may be, for example, adhesion or structurally fitting, so as to fix the magnetic element 40 to the sidewall 32. In other embodiments, the magnetic element 40 can be fitted on a surface of the external shell surface 10 facing the sidewall 32, and is disposed on the sidewall 32 by means of assembly.

The external shell surface 10 and the magnetic element 40 are magnetically attracted so as to fix the external shell surface 10 on an outer surface of one of the sidewalls 32. The external shell surface 10 can be an integral or a non-integral structure. At least one of the external shell surface 10 and the magnetic element 40 has a magnetic property (magnet), and the other is a ferromagnetic material, such as iron, cobalt, or nickel. In an embodiment, the magnetic element 40 is a strong magnetic (for example, an NdFeB magnet), so as to prevent the external shell surface 10 from falling off from a first side surface due to vibration or other external force. However, the present disclosure is not limited to the examples above. Alternatively, the external shell surface 10 may be magnetic, or both of the external shell surface 10 and the magnetic element 40 are magnets.

A number of the magnetic element 40 can be increased or decreased according to design requirements. Similarly, a position of the magnetic element 40 can also be adjusted according to design requirements. For example, in an embodiment of the present disclosure, the magnetic element 40 is disposed on the outer surface of the sidewall 32. However, in other embodiments, the magnetic element 40 can be combined and integrally formed with the sidewall 32. For example, the sidewall 32 is formed by a magnetic or a ferromagnetic material or is disposed on an inner surface of the sidewall 32, however, the present disclosure is not limited to the examples above.

A surface of the external shell surface 10 can have an appearance design with specific patterned holes, texts, graphics, prints, films, and/or colors, so as to enhance appearance design flexibilities and diversities. The external shell surface 10 can also serve as other purposes such as protection, heat dissipation, or waterproofness/dustproofness.

Referring to FIG. 2, the sidewall 32 disposed with the external shell surface 10 has a through hole 321. When a user is to remove the external shell surface 10, the cover 20 is first opened to locate a position of the through hole 32, and a push force is applied from inside to outside of the casing body through the through hole 321 and then to the external shell surface 10, so as to remove the external shell surface 10 from the sidewall 32.

The casing 100 having an external shell surface of the present disclosure may further include a lock 50 disposed at the cover 20 to close an internal space of the casing body. Thus, the external shell surface 10 can be prevented from being removed by an individual without a user's authorization. The lock 50 may be a conventional mechanical lock or electronic lock, or a password lock, the present disclosure is not limited to the examples above.

In addition, the external shell surface 10 may further include an opening 14 corresponding to an input/output (I/O) port, wherein a position of the opening 14 is away from the through hole 321.

Figure 3:
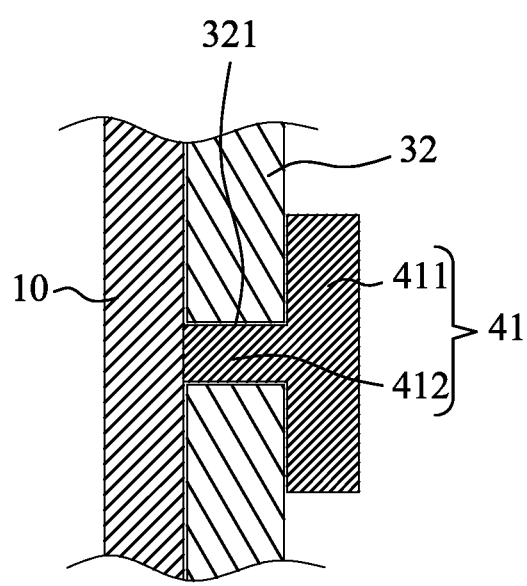
FIG. 3 is a sectional schematic diagram of a casing having an external shell surface according to an embodiment of the present disclosure.

Further, according to an embodiment of the present disclosure, as shown in FIG. 3, a magnetic element 41 is alternatively disposed on an inner surface of the sidewall 32.

The magnetic element 41 of an embodiment includes a head 411 and a neck 412. The head 411 is disposed on an inner surface of the sidewall 32, the neck 412 protrudes into the through hole 321 and is connected to the external shell surface 10, and a width of the head 411 is greater than a width of the through hole 321. This structure allows the magnetic element 41 to be stably located in the through hole 321, and prevents the magnetic element 41 from falling off unexpectedly and hence from losing the function of being attracted with the external shell surface 10.

Figure 4:
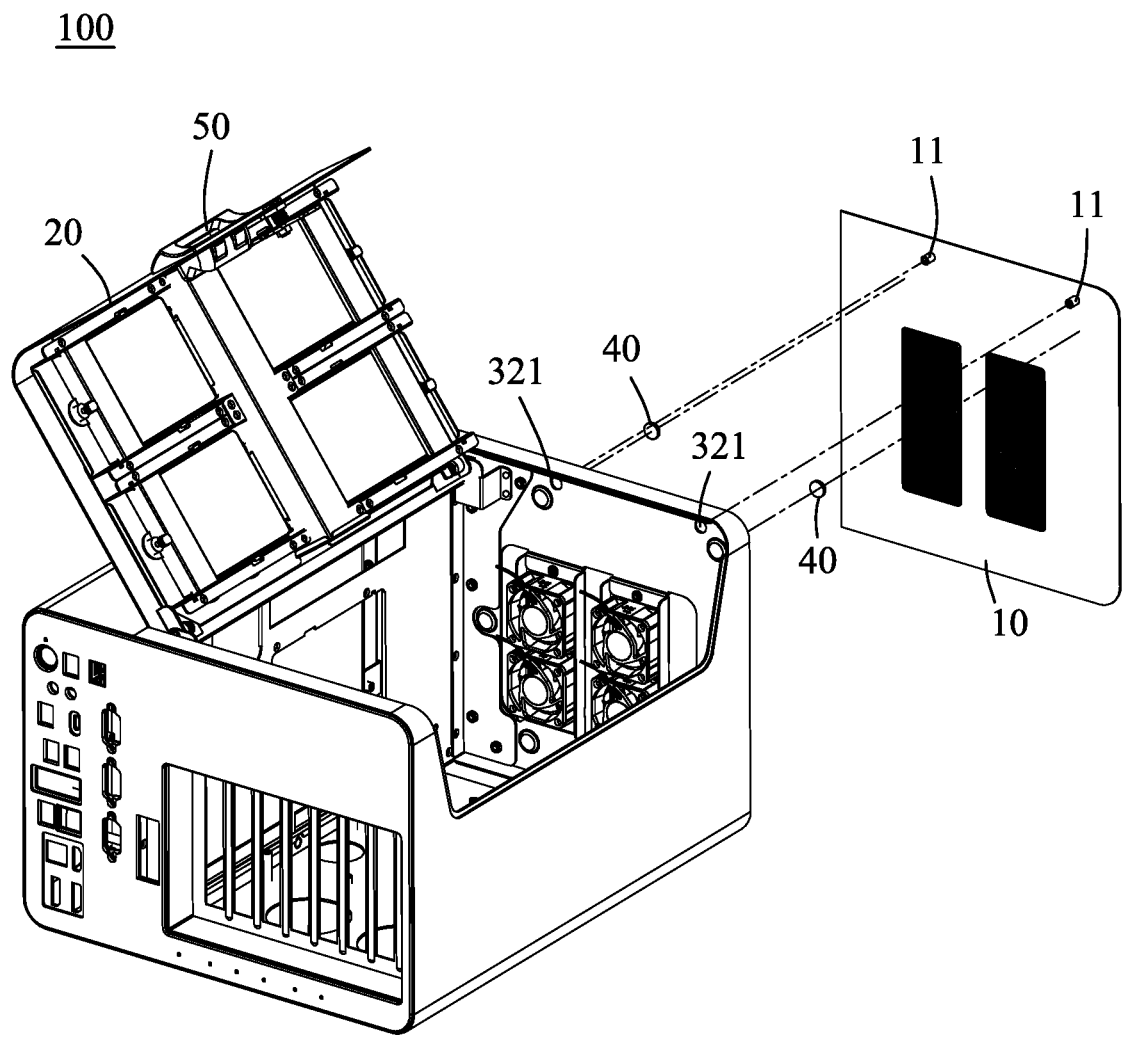
FIG. 4 is an assembly diagram of a casing having an external shell surface according to an embodiment of the present disclosure.

Further, according to an embodiment of the present disclosure, as shown in FIG. 4, the external shell surface 10 has a protruding column 11, which has a position corresponding to the through hole 321 and is accommodated in the through hole 321. By means of assembly, the protruding column 11 protrudes from an inner surface of the sidewall 32. When a user is to remove the external shell surface 10, the cover 20 needs to be opened to locate the position of the protruding column 11, and a push force is applied from inside to outside of the casing body to the protruding column 11, so as to remove the external shell surface 10 from the sidewall 32. The protruding column 11 facilitates the user to apply a force by hand.

Figure 5:
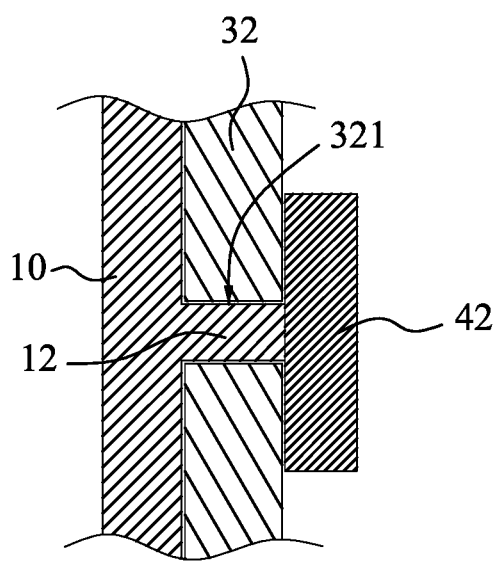
FIG. 5 is a sectional schematic diagram of a casing having an external shell surface according to an embodiment of the present disclosure.

Further, according to an embodiment of the present disclosure, as shown in FIG. 5, a difference from a previous embodiment is that, a protruding column 12 does not protrude from the inner surface of the sidewall 32, a magnetic element 42 is disposed on the inner surface of the sidewall 32 and is magnetically attracted with the protruding column 12, and a width of the magnetic element 42 is greater than the width of the through hole 321. This mechanism enables the external shell surface 10 to be more stably fitted on an outer surface of the sidewall 32 by means of the through hole 321, and the magnetic element 42 having a greater width is capable of preventing the external shell surface 10 from being pulled off unexpectedly from the outside.

The present invention is described by way of the preferred embodiments above. A person skilled in the art should understand that these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. A casing having an external shell surface, comprising:
   a casing body, comprising a plurality of sidewalls and a movable cover, the plurality of sidewalls and the movable cover enclosing to form a box shape;
   a magnetic element, disposed on at least one of the sidewalls of the casing body; and
   an external shell surface, wherein the external shell surface and the magnetic element are magnetically attracted so as to fix the external shell surface on an outer surface of one of the sidewalls;
   wherein the sidewall disposed with the external shell surface has a through hole.

2. The casing having an external shell surface according to claim 1, wherein the magnetic element is disposed on an outer surface of the sidewall.

3. The casing having an external shell surface according to claim 1, wherein the magnetic element is disposed on an inner surface of the sidewall.

4. The casing having an external shell surface according to claim 3, wherein the magnetic element comprises a head and a neck; the head is disposed on an inner surface of the sidewall, the neck extends into the through hole and is connected to the external shell surface, and a width of the head is greater than a width of the through hole.

5. The casing having an external shell surface according to claim 1, wherein the external shell surface has a protruding column, which has a position corresponding to the through hole and is accommodated in the through hole.

6. The casing having an external shell surface according to claim 5, wherein the protruding column protrudes from an inner surface of the sidewall.

7. The casing having an external shell surface according to claim 5, wherein the protruding column does not protrude from an inner wall of the sidewall, the magnetic element is disposed on the inner surface of the sidewall and is magnetically attracted with the protruding column, and a width of the magnetic element is greater than a width of the through hole.

8. The casing having an external shell surface according to claim 1, further comprising a lock disposed at the cover.

9. The casing having an external shell surface according to claim 1, wherein the external shell surface has an opening corresponding to an input/output (I/O) port, and the opening has a position avoided from the through hole.

* * * * *